(12) United States Patent
Miller et al.

(10) Patent No.: US 8,547,257 B2
(45) Date of Patent: Oct. 1, 2013

(54) DIGITAL ERROR CORRECTION IN AN ANALOG-TO-DIGITAL CONVERTER

(75) Inventors: John Earle Miller, Plano, TX (US); Robert Floyd Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 39 days.

(21) Appl. No.: 13/282,262

(22) Filed: Oct. 26, 2011

(65) Prior Publication Data

US 2013/0106628 A1 May 2, 2013

(51) Int. Cl.
*H03M 1/06* (2006.01)

(52) U.S. Cl.
USPC ........... 341/118; 370/252; 370/351; 714/785; 714/752; 714/776; 341/155; 341/160; 341/130; 341/140

(58) Field of Classification Search
USPC ......... 341/118–160; 370/252, 351; 714/478, 714/752, 776, 785
See application file for complete search history.

(56) References Cited

U.S. PATENT DOCUMENTS

| | | | | |
|---|---|---|---|---|
| 5,682,163 | A * | 10/1997 | Hsu | 341/156 |
| 6,819,271 | B2 * | 11/2004 | Geiger et al. | 341/87 |
| 6,885,319 | B2 * | 4/2005 | Geiger et al. | 341/87 |
| 6,933,875 | B1 * | 8/2005 | Wang | 341/161 |
| 7,369,075 | B2 * | 5/2008 | Ishii et al. | 341/144 |
| 7,764,212 | B2 * | 7/2010 | Lee et al. | 341/145 |

OTHER PUBLICATIONS

Nikaeen et al., "Digital Compensation of Dynamic Acquisition Errors at the Front-End of High-Performance A/D Converters", J. Selected Topics in Signal Processing, vol. 3, No. 3 (IEEE, Jun. 2009), pp. 409-418.

Marcellin et al., "Trellis Coded Quantization of Memoryless and Gauss-Markov Sources", Trans. Comm., vol. 38, No. 1 (IEEE, 1990), pp. 82-93.

Walden, "Analog-to-Digital Converter Survey and Analysis", J. Selected Areas in Communications, vol. 17, No. 1 (IEEE, 1999), pp. 539-550.

Moon, et al., "Digital Techniques for Improving the Accuracy of Data Converters", IEEE Communications Magazine (Oct. 1999), pp. 136-143.

Viterbi et al., "Trellis Encoding of Memoryless Discrete-Time Sources with a Fidelity Criterion", Trans. Information Theory, vol. IT-20, No. 3 (IEEE, 1974), pp. 325-332.

(Continued)

*Primary Examiner* — Lam T Mai
(74) *Attorney, Agent, or Firm* — Alan A. R. Cooper; W. James Brady, III; Frederick J. Telecky, Jr.

(57) ABSTRACT

An analog-to-digital converter (ADC) function in which digital error correction is provided. Parallel ADC stages are synchronously clocked to convert an analog input signal into digital words; at least one of the digital outputs is encoded according to an error correction code. Decision logic circuitry decodes a code word comprised of the concatenation of the digital outputs from the parallel stages, to derive a digital output from which the digital output word corresponding to the analog input signal can be derived. The decision logic circuitry can provide an error signal used to correct the state of one or more bits of the digital output from one of the ADC stages, for the case of a systematic code; alternatively, the decision logic circuitry can directly decode the code word to provide the digital output. The architecture may be applied to stages in a pipelined ADC.

19 Claims, 5 Drawing Sheets

(56) References Cited

OTHER PUBLICATIONS

Lundberg, "Analog-to-Digital Converter Testing", (self-published, Oct. 2002), available at http://web.mit.edu/klund/www/papers/UNP_A2Dtest.pdf.

Lundin, "An Introduction to ADC Error Correction", 5th Summer School on Data Acqusition Systems (Royal Institute of Technology, Stockholm, 2005).

"A Glossary of Analog-to-Digital Specifications and Performance Characteristics", Application Report SBAA147A (Texas Instruments Incorporated, 2008).

McNeill et al., "Split ADC Calibration for All-Digital Correction of Time-Interleaved ADC Errors", Trans. Circuit and Systems—II: Express Briefs, vol. 56, No. 5 (IEEE, 2009), pp. 344-348.

\* cited by examiner

DIGITAL ERROR CORRECTION IN AN ANALOG-TO-DIGITAL CONVERTER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of analog-to-digital converter circuits. Embodiments of this invention are directed to error correction and compensation in such circuits.

Despite the continuing trend toward the digitization of electronic circuits and systems over recent years, modern electronic systems must still often process and generate electrical signals in the analog domain. For example, analog signals are transmitted and received in many modern communications technologies, and analog signals are used in instrumentation and control systems. Data converter circuits are therefore required to provide an interface between the digital and analog domains, especially in those systems in which digital signal processing is applied. As is fundamental in the art, analog-to-digital converters (ADCs) convert analog measurements or signals into the digital data to which digital signal processing is applied. Conversely, digital-to-analog converters (DACs) convert digital data into analog signals for transmission or actuation of a physical device.

Advances in modern data converter circuits have resulted in extremely precise, high-speed, data conversion functions. For example, ADCs with resolutions of from twelve to twenty-four bits, at sample rates up to tens of megasamples per second, are now available from Texas Instruments Incorporated. This level of performance requires not only very rapid switching speeds, but also an extremely high degree of precision. Accordingly, difficult tradeoffs are involved in the design of modern data converter circuits. Typically, the designer and manufacturer is faced with the three-way tradeoff among circuit complexity and cost, sample rate, and accuracy.

One well-known type of analog-to-digital converter is the so-called pipelined ADC, which will now be described relative to FIG. 1. In this example, the pipelined ADC has three stages $10_0$ through $10_2$, each of which will generate one or more digital bits corresponding to the amplitude of an analog input signal. First, or most significant, pipeline stage $10_0$ receives the input analog signal at terminal ANALOG_IN, generates one or more digital bits on output D0, and also generates an analog residue that is presented to the next pipeline stage $10_1$. Pipeline stage $10_1$ similarly generates one or more digital bits on output D1 from this residue from stage $10_1$, and generates an analog residue that is forwarded to the next pipeline stage $10_2$. Stage $10_2$ generates one or more digital bits on output D2 corresponding to the residue from stage $10_1$, and forwards a residue to a next stage (not shown) if present. Digital outputs D0 through D2 are connected to digital correction function 11, which sum the digital bits from ADCs 3 into the eventual digital output on lines DIGITAL_OUT.

Pipeline stages $10_0$ through $10_2$ are similarly constructed as one another. In this conventional construction, with reference to stage $10_0$ by way of example, the input to the stage is connected to the input of sample-and-hold circuit 2, which is clocked to receive and store an analog voltage corresponding to the voltage at that input. The output of sample-and-hold 2 is applied to the input of analog-to-digital converter (ADC) 3, and also to an input of analog adder 4. ADC 3 generates a digital output consisting of one or more bits on output line D0; this digital output is also applied to the input of digital-to-analog converter (DAC) 5. In many popular cases, the pipelined ADC generates "1.5" bits per stage 10, referring to each ADC 3 generating a two bit output, but with some of the bits digitally combined by digital correction function 11 to effect digital error correction, as known in the art. DAC 5 also receives this digital value, and in the conventional manner generates an analog signal that is subtracted from the analog input signal, by adder 4, to generate a residue signal that is forwarded to the next stage $10_1$. This residue amounts to the difference between the input analog signal itself and an analog signal corresponding to the digital "integer" approximating the amplitude of the input analog signal; the next stage $10_1$ thus digitizes this residue value to produce the next-most significant bit or bits. Gain stage 7 "gains up" the residue from adder 4, so that the residue analog signal will vary over the full input dynamic range of next stage $10_1$, to avoid loss of sensitivity from stage to stage.

The conventional pipelined ADC approach of FIG. 1 provides some level of error correction in the analog-to-digital conversion process, as defined by the number of digital bits produced per stage and the number of stages, for a given level of precision (i.e., number of bits in the output word). In order to improve the error correction performance, however, the designer must either increase the number of pipeline stages, or increase the number of digital bits produced by each stage, either of which increases the circuit complexity and thus the cost, and may decrease the sample rate performance of the circuit.

Another conventional approach to improving the accuracy of analog-to-digital conversion is referred to in the art as "dithering". Dithering addresses inaccuracy due to systematic error in the ADC. As known in the art, systematic error is error inherent in the particular circuit realization of the ADC function. One manifestation of systematic error in ADCs is reflected as differential nonlinearity (DNL), which is a measure of the difference between the actual analog step width between digital output values and the ideal value that step width (i.e., one LSB). Systematic error is also reflected by integral nonlinearity (INL), which is the deviation of the actual transfer function from the ideal straight line transfer function, over the full-scale range. According to this technique, pseudo-random noise is added to the analog signal prior to analog-to-digital conversion, with the noise effects subtracted from the digital output in the digital domain to remove both the effects of random noise and also some of the systematic error of the ADC. However, the dithering technique necessarily introduces additional overhead circuitry into the analog interface, specifically by the circuitry required to inject the random noise into the input signal path.

By way of further background, post-conversion digital compensation of dynamic error in the ADC process, particularly dynamic errors in the track and hold function within typical ADC stages, is also a known technique. According to this approach, during calibration of the ADC, a digital signal processor extracts model parameters for the track-and-hold function. These model parameters are then applied by the digital signal processor by way of a digital compensation transfer function. However, the non-linear compensation function necessarily inserts significant computational burden on the digital circuitry, as evident by the necessity of a digital signal processor to derive and apply that compensation.

By way of further background, time-interleaved ADC circuits are known in the art. According to this architecture, multiple ADC circuits all receive the same input analog signal, but are operated in a time-interleaved fashion to produce a high data rate digital output. Each ADC can thus operate at a much lower speed than the eventual output data stream.

BRIEF SUMMARY OF THE INVENTION

Embodiments of this invention provide an analog-to-digital conversion (ADC) architecture that provides higher accuracy conversion with modest circuit complexity.

Embodiments of this invention provide such an architecture in which structured trade-offs among analog precision, conversion speed, and power consumption are enabled.

Embodiments of this invention provide such an architecture in which excellent accuracy performance is attained with modest digital computational load, and without impacting analog precision.

Embodiments of this invention provide such an architecture in which each stage in a pipelined ADC can operate at improved accuracy.

Other objects and advantages of embodiments of this invention will be apparent to those of ordinary skill in the art having reference to the following specification together with its drawings.

Embodiments of this invention may be implemented into an analog-to-digital conversion (ADC) architecture by providing two ADC stages that receive the analog input signal and are synchronously clocked to each convert the analog signal into respective digital words. The two digital words are considered together as an n bit code word representing a k bit information word (k<n), with the output of one of the ADC stages considered as the information word and the output of the other ADC stage as parity bits. Both the information word and the parity bits are provided to digital decoding circuitry, which decodes the n bit code word according to an error correction code. The decoded output provides an error word output that is applied to correction logic in the data path, to correct erred bits in the information word. Alternatively, the digital decoding circuitry may directly present the decoded information bits as the digital output; in that case, either a systematic or a non-systematic error correction code may be implemented.

BRIEF DESCRIPTION OF THE SEVERAL VIEWS OF THE DRAWING

FIG. 4b is a voltage plot illustrating the operation of the signal conditioning circuitry of FIG. 4a.

DETAILED DESCRIPTION OF THE INVENTION

The present invention will be described in connection with its embodiments, namely as analog-to-digital converters according to various implementations. It is to be understood that the following description is provided by way of example only, and is not intended to limit the true scope of this invention as claimed.

Figure 2:
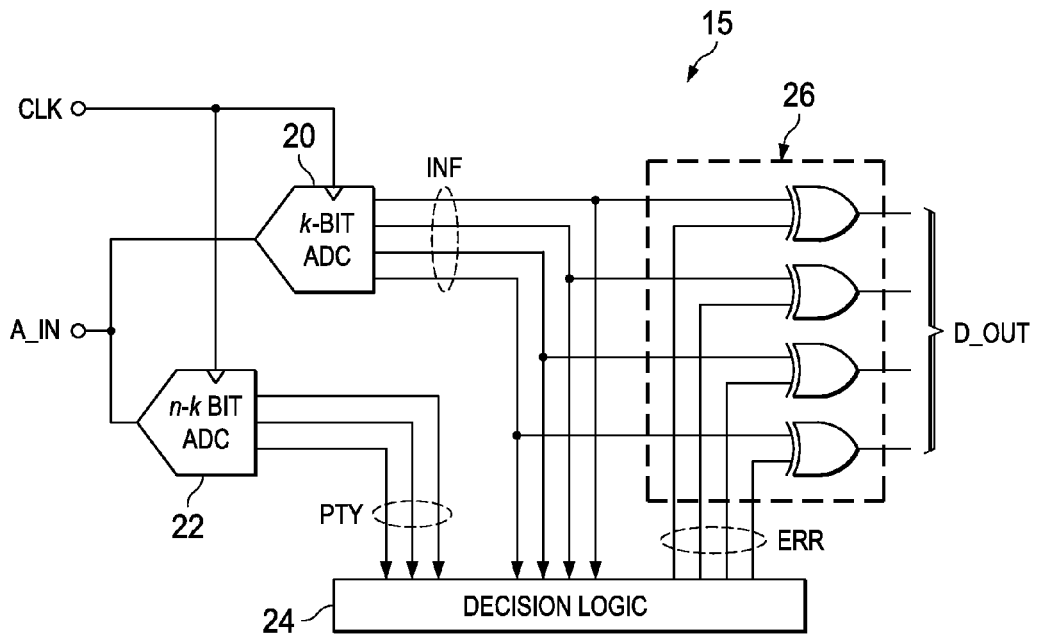
FIG. 2 is an electrical diagram, in block form, of an analog-to-digital converter according to an embodiment of the invention.

Referring now to FIG. 2, the construction and operation of analog-to-digital converter (ADC) 15 according to an embodiment of the invention will be described. ADC 15 according to this embodiment of the invention may serve as a stand-alone ADC circuit, for example as realized as a separate integrated circuit, or as a single-stage ADC circuit within a larger scale integrated circuit such as a single-chip communications or processing circuit as now commonly available, or as a stage in a pipelined ADC circuit, an example of which will be described in further detail below. It is contemplated that those skilled in the art having reference to this specification will be readily able to incorporate ADC 15 of this embodiment of the invention, and those according to other embodiments of the invention described in this specification, into any number of end use integrated circuits and applications, without undue experimentation.

As shown in FIG. 2, ADC 15 performs the function of receiving analog input signal A_IN and converting it into a k-bit digital output word D_OUT. According to the embodiment of the invention, ADC 15 includes two parallel analog-to-digital converter (ADC) functions 20, 22, both having an analog input receiving analog input signal A_IN, and both clocked synchronously by the same clock signal CLK in this example. As such, both of ADC functions 20, 22 perform an analog-to-digital conversion of analog input signal A_IN, sampled at nominally the same point in time (e.g., by sample-and-hold circuitry within ADC functions 20, 22, according to conventional construction, as controlled by clock signal CLK). The number of bits in the digital outputs of ADC functions 20, 22 may differ, according to embodiments of this invention. In the example of ADC 15 in FIG. 2, the total number of digital bits output by ADC functions 20, 22 is n, with k bits presented by ADC function 20 on lines INF, and n-k bits presented by ADC function on lines PTY.

According to this embodiment of the invention, the combination of the k bits on lines INF and the n-k bits on lines PTY constitutes an n-bit code word that represents k bits of information according to an error correction code. For the case of a systematic code, as implemented in ADC 15 of FIG. 2 according to this embodiment, the k bits presented by ADC function 20 on lines INF correspond to the "information", or "payload", bits of the code word, while the n-k bits presented by ADC function 22 on lines PTY correspond to the "parity", or "redundant", bits of that code word. In this systematic code case, it is contemplated that the k bits on lines INF may represent a binary word directly correlating to the magnitude of the sampled input analog signal A_IN (i.e., 0000 on lines INF corresponding to the minimum input level, 1111 on lines INF corresponding to the maximum input level, etc.). The n-k bits on lines PTY, on the other hand, are encoded by circuitry within ADC function 22 to correspond to the appropriate parity bits specified according to the particular error correction code implemented. Those skilled in the art will recognize that conventional ADC functions commonly incorporate output coding, for example as selectably presenting a digital output in straight binary format (signed or unsigned), 2's complement, 1's complement, and the like. In this embodiment of the invention, therefore, this output coding will be arranged to correspond to that indicated by the desired error correction code.

The k bits from ADC function 20 on lines INF and the n-k bits from ADC function 22 on lines PTY are presented to decision logic 24, in this embodiment of the invention. Decision logic 24 includes logic or programmable circuitry for decoding the n bit code word presented on lines INF, PTY according to the implemented error correction code, to generate a group of logic signals on lines ERR, each indicating whether an associated one of the k bits presented on lines INF is in error. Lines ERR are presented to correction logic 26, which corrects the logic states at lines INF according to the decoding results.

As known in the art, linear systematic error correction codes can be expressed in terms of a generator matrix G that is the product of an identity matrix $I_k$ having k rows and k columns, with a matrix $P_{k,n-k}$ of all possible code words of k information bits with their n-k associated parity bits:

$$G=[I_k P_{k,n-k}]$$

This generator matrix G serves to encode a k-bit information word $b_k$ to provide an n-bit code word $c_n$:

$$c_n = b_k G$$

In this example applying a systematic code, the k-bit information word $b_k$ is an explicit part of the n-bit code word $c_n$; generator matrix G thus serves to create and affix (prepend or append) the n-k parity bits. In non-systematic codes, the information word does not appear as part of the code word, but rather the entire code word is newly encoded. To decode a received n-bit code word $c_n$, which may include one or more bits that have been corrupted since encoding, to recover the correct originally-encoded k-bit information word $b_k$, a binary parity-check matrix H for the error correction code is defined as:

$$H=[P_{n-k,k}{}^T I_{n-k}]$$

and is applied to the received n-bit code word $c_n$:

$$s_{n-k} = c_n H^T$$

to derive syndrome $s_{n-k}$, which is an n-k bit word indicative of whether any of the n bits of the received code word $c_n$ is in error, and if so, which bit or bits are the errored bits. If syndrome $s_{n-k}$ is zero-valued, there are no errors in the received code word $c_n$, at least as detected by the error correction algorithm.

Referring back to FIG. 2, decision logic 24 decodes the code word consisting of the k bits on lines INF and the n-k bits on lines PTY, for example by applying the appropriate parity-check matrix H for the particular error correction code to that code word. It is contemplated, in connection with this invention, that any linear error correction code (e.g., Hamming code, convolutional codes, trellis codes) is suitable for use in connection with this invention. In response to the syndrome $s_{n-k}$ resulting from the decoding operation, decision logic 24 generates logic signals on the k lines ERR, each associated with one of the k bits on lines INF from ADC function 20, and indicating whether the decoding carried out by decision logic 24 has determined its associated information bit to be in error. Correction logic 26, in this example, is realized by a group of exclusive-OR gates, each having an input receiving one of the k bits from lines INF and an input receiving a logic signal from a corresponding one of lines ERR from decision logic 24, and presents a corresponding one of the k bits of digital output word D_OUT at its output. In this example, lines ERR each indicate an errored bit by a "1" level, and a correct bit by a "0" level. In operation therefore, correction logic 26 inverts the states of the k bits on lines INF for which the corresponding logic signal on line ERR from decision logic 24 is a "1" level, and passes the states of those of the k bits on lines INF for which the corresponding signal on line ERR is a "0", to generate the digital output word D_OUT. The output of decision logic 26 on lines D_OUT thus presents a k-bit digital conversion of the analog input signal A_ON.

Figure 3:
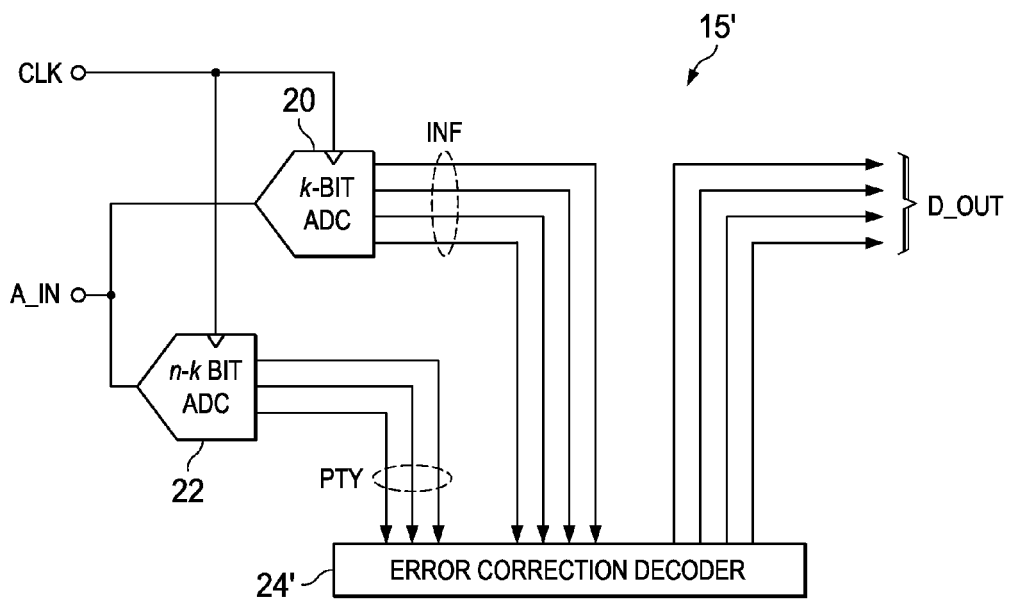
FIG. 3 is an electrical diagram, in block form, of an analog-to-digital converter according to another embodiment of the invention.

FIG. 3 illustrates analog-to-digital converter 15' according to another embodiment of the invention. ADC functions 20, 22 are constructed as k-bit and n-k bit analog-to-digital converters, as before. And as before, ADC functions 20, 22 receive analog input signal A_IN in parallel at their analog inputs, and generate k-bit and n-k bit digital outputs on lines INF, PTY, respectively, from samples of analog input signal A_IN acquired synchronously with clock signal CLK. The output of ADC function 22 is encoded according to the particular error correction code utilized, as before. The signals on lines INF, PTY are applied to decision logic 24' as in the embodiment of the invention shown in FIG. 2. In this embodiment of the invention, decision logic 24' is constructed as error correction decoder circuitry, implemented by custom or programmable logic, arranged or programmed (as the case may be) to carry out the particular decoding algorithm for the error correction code being utilized. In this embodiment of the invention, rather than generating an error word on lines ERR from which the output of ADC function 20 may be corrected as detected, error correction decoder 24' directly generates a decoded data word on lines D_OUT from the code word constituted by the concatenation of the logic signals on lines INF, PTY.

ADC 15' of this embodiment of the invention is therefore suited for either systematic or non-systematic error correction codes, as it directly generates the output word D_OUT from the incoming code word on lines INF, PTY. For the case of a non-systematic code, the signals generated by ADC function 20 on lines INF will also be encoded according to the particular non-systematic error correction code, and as such will not necessarily represent the "information" portion of the code word presented to error correction decoder 24'. Conversely, in the case of a systematic code, ADC function 20 will generate a k-bit digital conversion of the analog level at input A_IN as before, with the corresponding digital output on lines INF will correspond to the "information" portion of that code word; the digital word on lines PTY will have been encoded by ADC function 22 according to the particular error correction code, as mentioned above. It is contemplated that those skilled in the art having reference to this specification will be readily able to implement either a systematic or a non-systematic error correction code into ADC 15' according to this embodiment of the invention, without undue experimentation.

In each of the embodiments of the invention described above in connection with FIGS. 2 and 3, as mentioned above, the n-k bits output by ADC function 22 may be fewer in number than the k bits output by ADC function 20. Accordingly, the resolution of ADC function 22 will inherently be coarser (i.e., fewer digital steps over the range of the analog input signal) than the resolution of ADC function 20. For example, if the error correction code applied by ADC 15, 15' is a (7, 4) Hamming code, the number of lines INF from ADC function 20 will be four, and the number of lines PTY from ADC function 22 will be three. ADC function 20 will thus digitize the analog input signal over sixteen steps, while ADC function 22 will nominally digitize the analog input signal over eight steps. The combination of the digital values on lines INF and PTY will therefore not readily produce coherent code words.

This difficulty is overcome by incorporating signal conditioning circuitry at ADC function 22 so that the appropriate parity bits are presented on lines PTY to decision logic 24, 24'. The construction and operation of an embodiment of the invention incorporating an example of this signal conditioning circuitry is illustrated in FIGS. 4a and 4b, as will now be described.

Figure 4A:
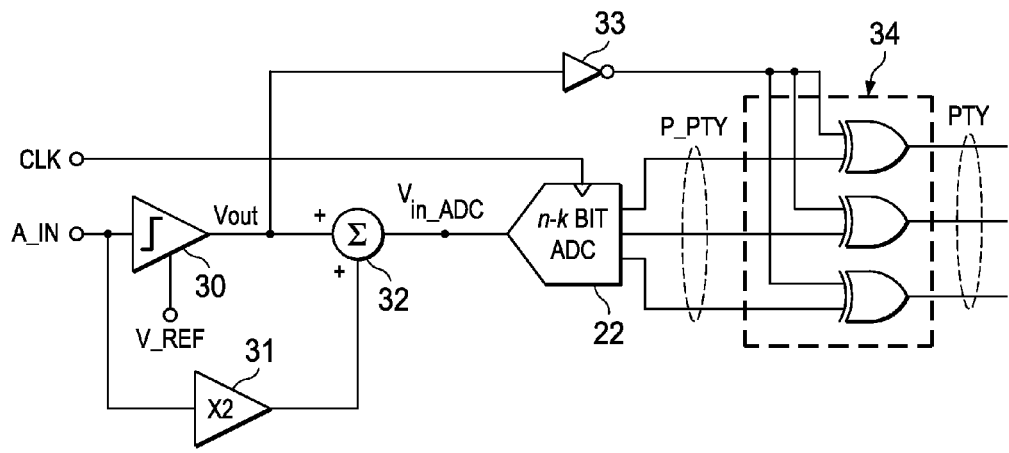
FIG. 4a is an electrical diagram, in block form, of signal conditioning circuitry as implemented in connection with an ADC stage in an analog-to-digital converter according to an embodiment of the invention.
Figure 4B:
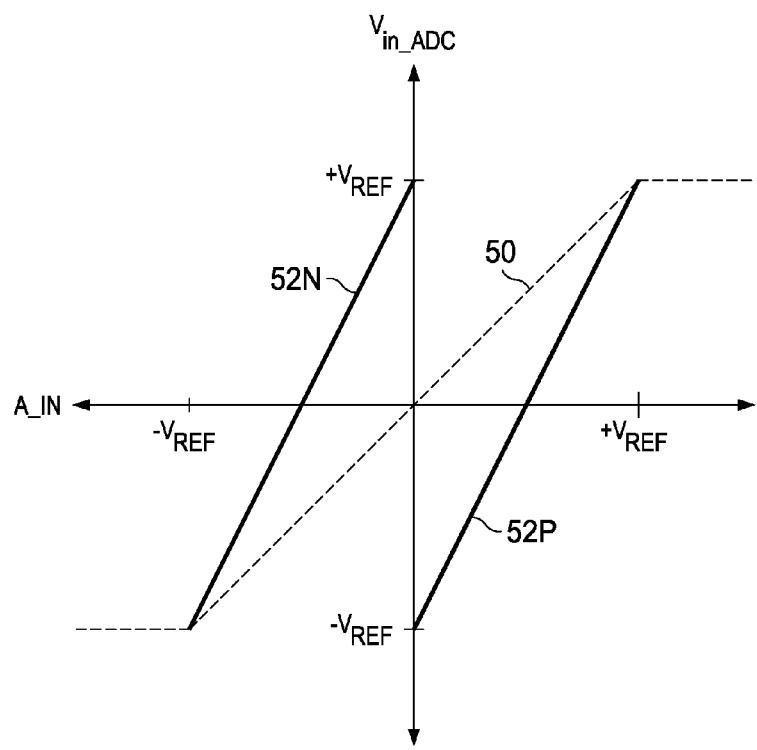

FIG. 4a illustrates the implementation of signal conditioning circuitry with n-k bit ADC function 22, for the example in which n-k is less than k by one. As described above by way of the (7,4) code example, in that case the resolution of ADC function 22 is thus one half that of ADC function. As shown in FIG. 4a, analog input signal A_IN is applied to threshold comparator 30, which compares the input analog level against a threshold voltage (e.g., ground). The output of comparator 30 is applied to the an input of adder 32; another input of adder 32 receives analog input signal A_IN after amplification by amplifier 31, which applies a gain of two in this example. The output of adder 32, at node $V_{in\_ADC}$, is applied to the input of ADC function 22. The output of comparator 30 at node $V_{out}$ is also applied, via inverter 33, to inverting logic 34, which is constructed as a group of exclusive-OR gates, each with an input connected to an associated one of the n-k output lines from ADC function 22 (on lines P_PTY in this example); the other input of each exclusive-OR gate in inverting logic 34 receives the output of comparator 30. The outputs of the exclusive-OR gates within inverting logic 34 drive lines PTY, which will be applied to decision logic 24, 24' as described above relative to FIGS. 2 and 3.

In operation, threshold comparator 30 determines whether analog input signal A_IN is currently in the upper or lower "half" of its full range, in this example in which n-k is one less than k. As such, the threshold voltage against which comparator 30 compares the current voltage of analog input signal A_IN is nominally at the midpoint of the range of analog input signal A_IN. FIG. 4b illustrates the nominal range of analog input signal A_IN extending from negative reference voltage $-V_{REF}$ to positive reference voltage $+V_{REF}$, by way of plot 50. This voltage would of course be applied directly to the input of ADC function 22 in the absence of the signal conditioning circuitry. In this example of FIGS. 4a and 4b, the midpoint voltage against which threshold comparator 30 compares analog input level A_IN is ground, or 0 volts. According to this example, threshold comparator 30 is constructed to provide the following response voltage at node $V_{out}$:

$$V_{out}=+V_{REF} \text{ for } A\_IN \leq 0 \text{ volts};$$

$$V_{out}=-V_{REF} \text{ for } A\_IN > \text{volts}$$

At adder 32, this voltage at node $V_{out}$ is added to the 2× amplified voltage of analog input signal A_IN, with the resulting sum then applied to the analog input of ADC function 22 for digitization. As a result, the behavior of the voltage at node $V_{in\_ADC}$ as applied to the analog input of ADC function 22 follows plot 52N of FIG. 4b for analog input signal A_IN below the threshold voltage of ground:

$$V_{in\_ADC}=+V_{REF}+2V_{out} \text{ for } A\_IN \leq 0 \text{ volts}$$

and follows plot 52P for analog input signal A_IN above the threshold voltage of ground:

$$V_{in\_ADC}=+V_{REF}+2V_{out} \text{ for } A\_IN > 0 \text{ volts}$$

As evident from plots 52N, 52P in FIG. 4b, the analog voltage applied to ADC function 22 is conditioned to extend over the full input range twice, over the nominal range of analog input signal A_IN from $-V_{REF}$ to $+V_{REF}$. This input signal conditioning thus allows n-k bit ADC function 22 to operate at the same step resolution as k-bit ADC function 20, where n-k is one less than k.

To complete the signal conditioning function of this embodiment of the invention, in particular to ensure proper error correction by decision logic 24, 24', the output of ADC function 22 is modified by inverting logic 34 in response to the threshold determination of comparator 30. For the example of a (7,4) Hamming code, the code words corresponding to adjacent information states (i.e., corresponding to a single LSB change at the output of ADC function 20) differ from one another in three bit positions. Accordingly, the coding of code words on lines INF and PTY according to this embodiment of the invention corresponds to:

| State | k information bits (from ADC function 20) | | | | n-k parity bits (from ADC function 22 and logic 34) | | |
|---|---|---|---|---|---|---|---|
| 15 ($+V_{REF}$) | 1 | 0 | 0 | 0 | 1 | 0 | 1 |
| 14 | 1 | 0 | 1 | 0 | 0 | 1 | 1 |
| 13 | 1 | 0 | 1 | 1 | 0 | 0 | 0 |
| 12 | 1 | 0 | 0 | 1 | 1 | 1 | 0 |
| 11 | 1 | 1 | 0 | 1 | 0 | 0 | 1 |
| 10 | 1 | 1 | 0 | 0 | 0 | 1 | 0 |
| 9 | 1 | 1 | 1 | 0 | 1 | 0 | 0 |
| 8 | 1 | 1 | 1 | 1 | 1 | 1 | 1 |
| 7 | 0 | 1 | 1 | 1 | 0 | 1 | 0 |
| 6 | 0 | 1 | 0 | 1 | 1 | 0 | 0 |
| 5 | 0 | 1 | 0 | 0 | 1 | 1 | 1 |
| 4 | 0 | 1 | 1 | 0 | 0 | 0 | 1 |
| 3 | 0 | 0 | 1 | 0 | 1 | 1 | 0 |
| 2 | 0 | 0 | 1 | 1 | 1 | 0 | 1 |
| 1 | 0 | 0 | 0 | 1 | 0 | 1 | 1 |
| 0 ($-V_{REF}$) | 0 | 0 | 0 | 0 | 0 | 0 | 0 |

In this example, the digitized levels corresponding to analog input signal A_IN advance from state 0 for an analog input level of $-V_{REF}$, to state 15 for an analog input level of $+V_{REF}$. The k information bits corresponding to that progression of digitized levels advance in the conventional Gray coded binary progression (i.e., adjacent digital values of the k information bits differ in one and only one bit position). And in this example, for states 0 through 7 corresponding to the analog input signal A_IN ranging between $-V_{REF}$ and 0 volts (plot 52N of FIG. 4b), the n-k parity bits at lines P_PTY from ADC function 22 are coded according to the (7,4) Hamming code for those eight levels over that range. The eight available digital output levels from ADC function 22 expressed by n-k=3 bits over the full voltage range at node $V_{in\_ADC}$ thus are at the same resolution as the eight levels (out of the sixteen available) expressed by the k=4 bits at the output of ADC function 20, which receives and converts analog input signal A_IN directly. And as evident from the foregoing table, the n-bit code words (information and parity bits) for adjacent states differ in three and only three bit positions, as defined for the (7,4) Hamming code.

For the upper half of the range of analog input signal A_IN (0 volts to $+V_{REF}$), the k information bits output by ADC function 20 continue the four-bit Gray coded binary progression in states 8 through 15. For these states 8 through 15, (plot 52P of FIG. 4b), the n-k parity bits at lines P_PTY from ADC function 22 are identical to those from states 0 to 7 according to the (7,4) Hamming code, and are at the same resolution as the eight levels (out of the sixteen available) expressed by the k=4 bits at the output of ADC function 20. But in this case, inverting logic 34 is controlled by the output of comparator 30 to invert the state of the bits on lines P_PTY, to generate the states on lines PTY that are applied to decision logic 24, 24'. This inversion is expressed in the n-k parity bits for states 8 through 15 in the above table, which is a bit-wise logical inversion of the corresponding parity bits for respective states 0 through 7 (e.g., the parity bits for state 8 is the bit-wise inversion of the parity bits for state 0, etc.). As a result, the n-bit code words (information and parity bits) for adjacent states over all of states 0 through 15 differ in three and only three bit positions, as defined for the (7,4) Hamming code.

It is of course contemplated that the particular implementation and operation of signal conditioning circuitry and the corresponding encoding from ADC function 22 can vary from that described above relative to FIGS. 4a and 4b, as appropriate for a particular input signal range and for a particular error correction code. It is contemplated that those skilled in the art having reference to this specification will be readily able to implement such signal conditioning circuitry in connection with a wide range of implementations, without undue experimentation.

Figure 5:
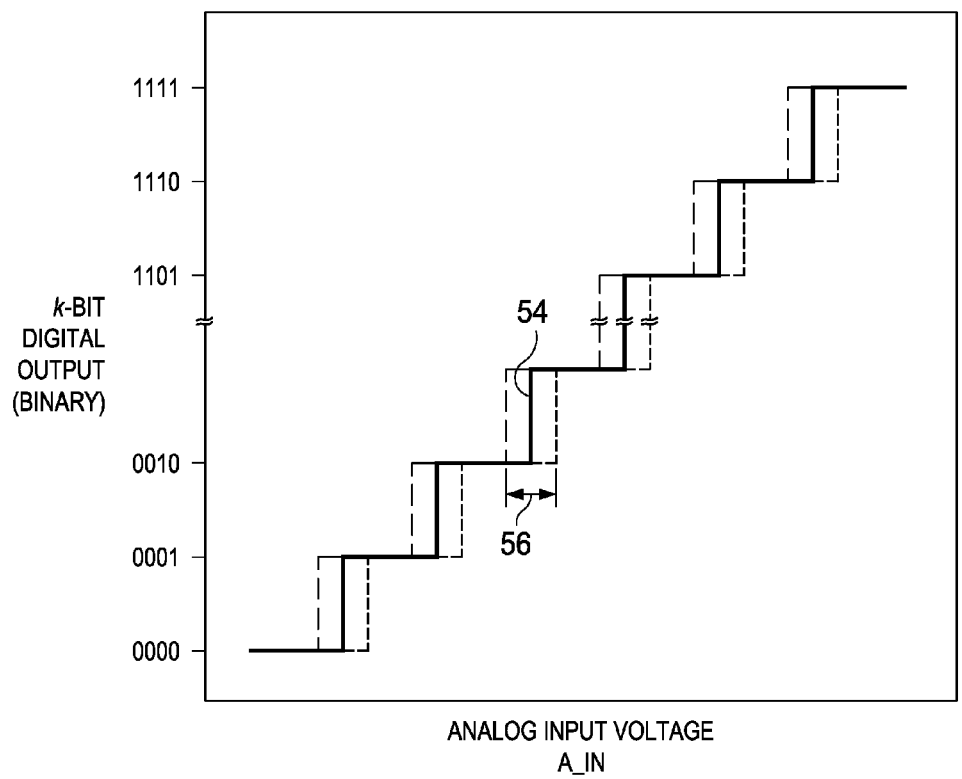
FIG. 5 is a plot illustrating differential non-linearity for an ADC stage.

As known in the art, a common measure of the accuracy of an analog-to-digital converter function (e.g., ADC functions 20, 22) is its differential non-linearity (DNL). As discussed above, the DNL of an ADC function is a measure of the difference between its actual analog step width between digital output values, and the ideal value that step width (i.e., one LSB). FIG. 5 illustrates the DNL measure by way of a transfer function plot. In this FIG. 5, transfer function plot 54 illustrates the ideal transfer function between analog input voltage (A_IN) and a k-bit digital output code for ADC function 20, by way of reference. DNL error is manifest by variations from ideal plot 54 in the analog voltage thresholds at which the ADC function changes its digital output state. Variation plots 56 illustrate this DNL error from plot 54 at one of the thresholds. In many actual ADC functions, this error will differ from threshold to threshold over the operating range. For a given ADC function over its operating range, the DNL is defined as the maximum deviation from ideal plot 54 over the operating range.

In any of the above embodiments of the invention, it is particularly beneficial for the error characteristics of ADC functions 20, 22 to be uncorrelated from one another, particularly in connection with DNL error. In other words, it is particularly useful to ensure that both of ADC functions 20, 22 do not have the same large DNL error at the same code transitions as one another. This allows the error correction coding to optimally correct for inaccuracies in the conversion, by reducing the possibility that both ADC functions 20, 22 will present a coding error at the same analog input level. As known in the art, the error performance of ADC functions in modern integrated circuits are typically measured in manufacture, and adjusted by way of trimming (e.g., by setting control values in trimming registers). It is therefore contemplated that ADC functions 20, 22, will be measured and trimmed in this manner to achieve the best error correction performance of ADC 15, 15', according to embodiments of this invention.

Figure 6:
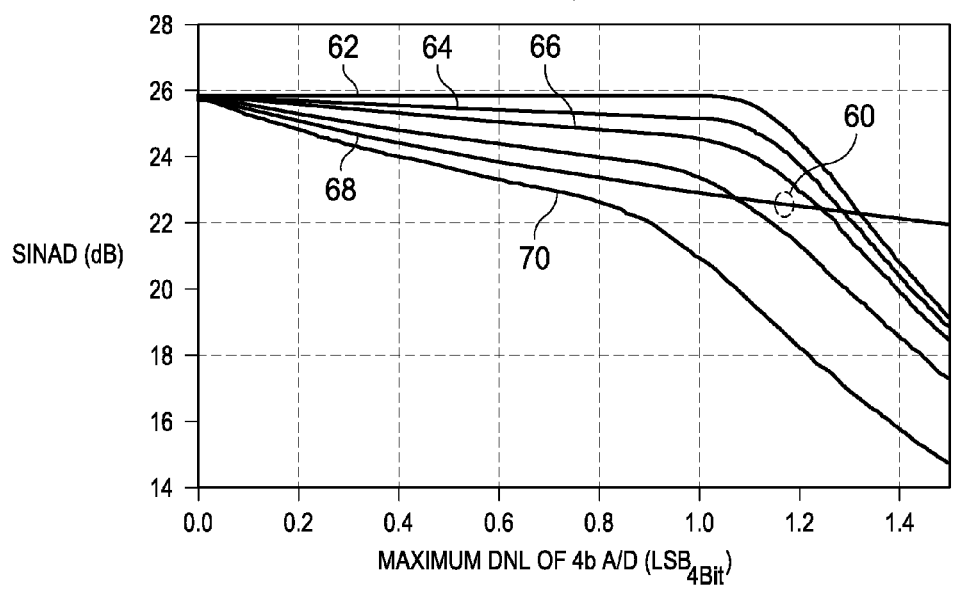
FIG. 6 is a plot illustrating the accuracy performance of various implementations of the analog-to-digital converter of an embodiment of the invention.

According to embodiments of this invention, improved accuracy in analog-to-digital conversion is provided, without substantially increasing the complexity and cost of the converter circuitry. This improved accuracy results from the power of the error correction coding as generated by parallel ADC functions 20, 22, and the decoding provided by decision logic 24, 24'. FIG. 6 illustrates examples of the expected improvement in conversion accuracy, as based on simulation and as will now be described.

Figure 1:
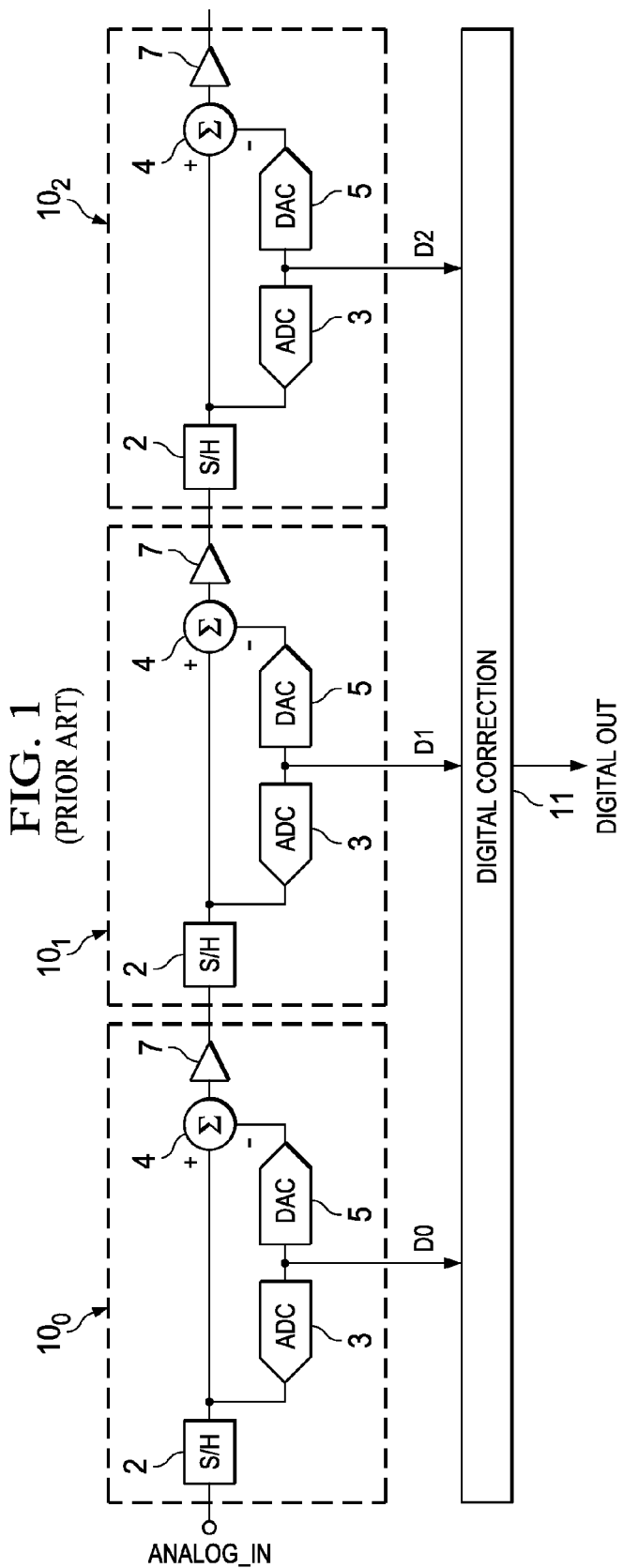
FIG. 1 is an electrical diagram, in block form, of a conventional pipelined analog-to-digital converter.

FIG. 6 illustrates a set of curves of the measure SINAD, which is the ratio of signal to noise plus distortion, and is a common measure in the analog-to-digital conversion art. In FIG. 6, the curves illustrate the response of SINAD to the maximum DNL of a four-bit ADC function, such as may be used as ADC function 20 (for k=4) in the example of a (7,4) Hamming code as described above relative to FIGS. 2 through 4b. The maximum DNL measure along the horizontal axis in FIG. 6 is expressed in terms of the least-significant bit (LSB) in this four-bit conversion, with a maximum DNL of 1.5 LSB indicating that the maximum DNL error of the 4-bit ADC function is an entire step width. In this regard, to provide a frame of reference, curve 60 of FIG. 6 represents the SINAD behavior of a four-bit, three-stage pipelined ADC that uses 1.5 bits per stage (e.g., similar to that described above in connection with FIG. 1).

As described above, for ADC 15, 15' constructed according to embodiments of this invention and applying a (7,4) Hamming code as the error correction code, ADC function 20 will be a four-bit ADC, and ADC function 22 will be a three-bit ADC. In this implementation, if ADC function 22 is an "ideal" three-bit ADC (i.e., max DNL=0), the arrangement of ADC 15 will result in essentially ideal SINAD performance even if the maximum DNL of ADC function 20 is as high as 1.0 LSB, as shown by the simulation results of curve 62 in FIG. 6. Of course, actual implementations of ADC function 22 will have some level of DNL. According to embodiments of this invention, curves 64, 66, 68 illustrate the SINAD performance of ADC 15, 15' for situations in which the maximum DNL of three-bit ADC function 22 is 0.125, 0.25, and 0.5 times the maximum DNL of four-bit ADC function 20, respectively. Considering that ADC function 22 has a coarser nominal resolution than that of ADC function 20 (three-bit versus four-bit), it is contemplated that these levels of DNL performance relative to ADC function 20 are readily achievable in modern implementations. And as evident from FIG. 6, each of these curves 64, 66, 68 provide improved accuracy in digital conversion as compared with the three-stage pipelined ADC exhibited by curve 60.

For the sake of comparison, curve 70 illustrates the simulated SINAD performance of an implementation of ADC 15, 15' with the maximum DNL of ADC function 22 matching that of ADC function 20, which results in poorer performance than the three-stage pipelined case of curve 60.

According to embodiments of this invention, therefore, an analog-to-digital converter is provided that enables improved accuracy over conventional pipelined ADC architectures, while being implemented in a much more efficient manner, and involving a single ADC stage in the primary data path. This construction therefore relaxes the difficult tradeoff of performance versus precision versus circuit complexity that faces the designers of analog-to-digital converters and larger scale circuits and systems utilizing such converters.

As mentioned above, ADC 15, 15' can be implemented much more efficiently than a conventional pipelined ADC, yet provide improved accuracy. According to another embodiment of the invention, however, additional precision and accuracy can be provided by incorporating the error correction architecture within each stage of a pipelined analog-to-digital converter. By doing so, accuracy of each stage in the pipeline is improved, resulting in even further accuracy when combined with the correction capability of the pipelined ADC architecture.

Figure 7:
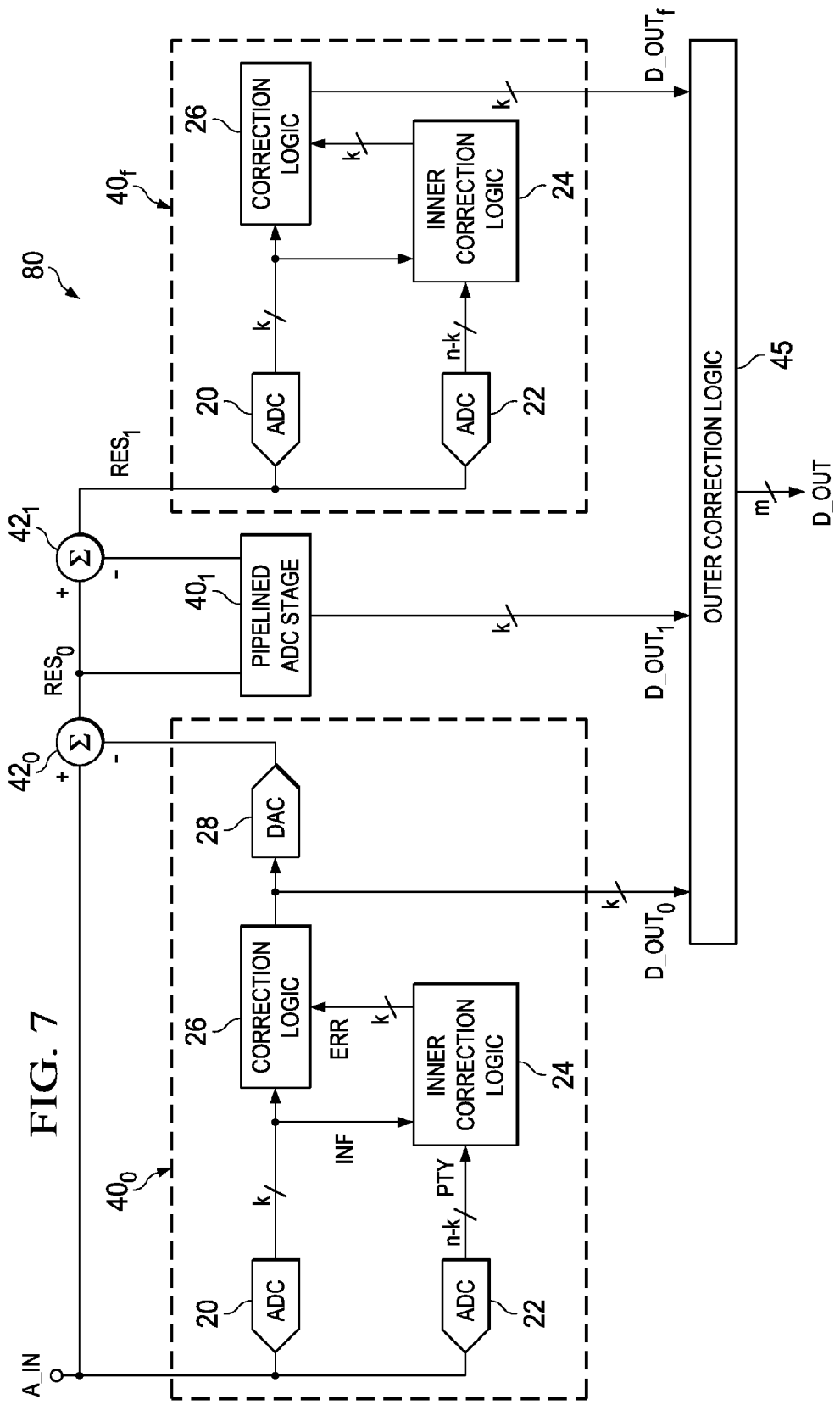
FIG. 7 is an electrical diagram, in block form, of a pipelined analog-to-digital converter according to an embodiment of the invention.

FIG. 7 illustrates a simplified example of pipelined analog-to-digital converter 80 according this embodiment of the invention. In this example, ADC 80 includes three stages $40_0$, $40_1$, $40_f$, connected in pipeline fashion as described above in connection with FIG. 1. First pipelined stage $40_0$ is constructed substantially as ADC 15 described above, including ADC functions 20, 22 that are synchronously clocked (clock signal CLK not shown in FIG. 7) to produce k and n-k bit outputs on lines INF, PTY, respectively. Signal conditioning circuitry as described above in connection with FIGS. 4a and 4b may be implemented in connection with ADC function 22, as appropriate for the error correction code. Digital output lines INF, PTY are applied to inner correction logic 24, which decodes the code words presented by ADC functions 20, 22 to generate error word ERR, which is applied to the data word from ADC function 20 on lines INF, via correction logic 26. All or part of the output word from correction logic 26 is presented to outer correction logic 45 on lines $D\_OUT_0$, as shown. Alternatively, first pipelined stage $40_0$ (and all of stages 40 in ADC 80 according to this embodiment of the invention) may be constructed in the manner described above in connection with ADC 15' of FIG. 3, in which decision logic 24' directly generates the k-bit corrected digital value by decoding the code word on lines INF, PTY according to the error correction cod.

In addition, first pipelined stage $40_0$ also includes digital-to-analog converter (DAC) 28. DAC 28 is a conventional DAC circuit that receives the k lines $D\_OUT_0$ from correction logic 26, and converts the digital word on those lines $D\_OUT_0$ to an analog level that is in turn presented to a negative input of adder $42_0$ outside of first pipelined stage $40_0$. As typical in pipelined ADCs, the positive input of adder $42_0$ receives the analog input signal A_ON; the output of adder $42_0$ presents the difference between these inputs at its output, as analog residue signal $RES_0$. Next pipelined stage $40_1$, which is constructed similarly as first pipeline stage $40_0$, converts this residue signal into a digital word, at least part of which is forwarded to outer correction logic 45 on lines $D\_OUT_1$. This digital word is again converted to analog within pipelined stage $40_1$, and applied to adder $42_1$ for subtraction from residue signal $RES_0$, generating a next residue signal $RES_1$ that is forwarded down the pipeline for conversion to digital at the next stage.

Final stage $40_f$ is constructed similarly as pipelined stages $40_0$, $40_1$, including ADC functions 20, 22, inner correction logic 24, and correction logic 36 as before. ADC functions 20, 22 are synchronously clocked, to digitally convert the residue signal at nominally the same time. However, final stage $40_f$ does not include an instance of DAC 28, as there is no further ADC stage in the pipeline beyond final stage $40_f$. In this example, correction logic 26 generates digital output word $D\_OUT_f$, which is applied to outer correction logic 45 as in the case of the other stages 40 in ADC 80.

Outer correction logic 45 is constructed to decode the sets of digital values received on lines $D\_OUT_0$, $D\_OUT_1$, $D\_OUT_f$ in this three-stage example, according to the desired architecture. For example, outer correction logic 45 may perform a conventional pipeline sum as described above in connection with FIG. 1. Alternatively, outer correction logic 45 may decode the digital outputs from stages 40 according to a different error correction code; in this manner, ADC 80 operates according to a "nested" error correction code, further improving the overall accuracy of the analog-to-digital conversion function. For example, an (n, k) Hamming code may be used as the inner code (i.e., decoded by inner correction logic 24 in each stage 40), and an (N, K) Reed-Solomon code may be used as the outer code, decoded by outer correction logic 45. In that nested or concatenated code approach, the overall error-correcting capability can approach the product of the capabilities of the inner and outer codes, drastically increasing the error correction approach as compared to the individual codes. It is contemplated that those skilled in the art having reference to this specification will be readily able to implement the appropriate summing or correction functions within outer correction logic 45, without undue experimentation.

According to embodiments of this invention, an analog-to-digital conversion (ADC) architecture and operational approach may be implemented with relatively modest circuit complexity, yet providing higher accuracy conversion than many more complex DC circuits and functions. These embodiments of the invention relax the difficult trade-offs among analog precision, conversion speed, and circuit complexity that are typically presented by conventional ADC designs, by providing such improved accuracy. For example, the effective error correction in the analog-to-digital conversion provided by this invention can relax either or both of the design constraints of sample rate and circuit complexity, resulting in an ADC with the desired performance at modest cost. The pipelined ADC case, such as described above in connection with FIG. 7, provides additional flexibility to the designer in trading off analog precision within the pipeline signal chain (i.e., within the pipeline stages) while maintaining overall performance and accuracy in the analog-to-digital conversion.

It is contemplated that modifications of, and alternatives to, the embodiments of the invention described in this specification, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An analog-to-digital converter, comprising:
   a first analog-to-digital converter (ADC) stage, having an input receiving an analog input signal, and having a digital output, for generating a data word at the digital output corresponding to a sample of the analog input signal;
   a second ADC stage, having an input receiving the analog input signal, and having a digital output, for generating a data word at the digital output corresponding to a sample of the analog input signal and according to an error correction code; and
   decision logic, having a digital input coupled to the digital outputs of the first and second ADC stages, for decoding the data words from the first and second ADC stages into a decoded digital word responsive to the digital outputs of the first and second ADC stages,
   wherein the decision logic decodes the data words from the first and second ADC stages according to an error correction code to present, at an error output, an error word indicating errored bits in the digital data word presented by the first ADC stage;
   and further comprising:
      correction logic, having an input coupled to the output of the first ADC stage and having an input coupled to the error output of the decision logic, the correction logic for correcting the data word presented by the first ADC stage responsive to the error word, and presenting at an output a corrected digital data word corresponding to a digital conversion of the sample of the analog input signal.

2. The analog-to-digital converter of claim 1, wherein the output of the first ADC stage is a k-bit digital output;
wherein the output of the second ADC stage is an n-k bit digital output;
and wherein the decision logic decodes the data words from the first and second ADC stages according to an (n, k) systematic code.

3. The analog-to-digital converter of claim 2, wherein the systematic code is a linear error correction code.

4. The analog-to-digital converter of claim 2, wherein n-k is less than k;
and further comprising:
signal conditioning circuitry, coupled to receive the analog input signal and having an output coupled to the input of the second ADC stage, for modifying the analog signal prior to application to the second ADC stage and the data word at the output of the second ADC stage so that the resolution of the second ADC stage matches that of the first ADC stage.

5. The analog-to-digital converter of claim 1, wherein the decision logic has a digital data output for presenting a digital data word corresponding to the analog input signal.

6. The analog-to-digital converter of claim 5, wherein the decision logic decodes the data words from the first and second ADC stages according to a systematic code.

7. The analog-to-digital converter of claim 5, wherein the decision logic decodes the data words from the first and second ADC stages according to a non-systematic code; and wherein the first and second ADC stages each generate a data word at their digital output corresponding to a sample of the analog input signal and according to the non-systematic code.

8. The analog-to-digital converter of claim 1, wherein each of the first and second ADC stages have a clock input, for controlling the sampling of the analog input signal;
and wherein the first and second ADC stages receive the same clock signal at their clock inputs, in parallel.

9. A pipelined analog-to-digital converter, comprising:
at least one pipelined stage, each pipelined stage comprising:
a first analog-to-digital converter (ADC) stage, having an input receiving an analog input signal, and having a digital output, for generating a data word at the digital output corresponding to a sample of the analog input signal; and
a second ADC stage, having an input receiving the analog input signal, and having a digital output, for generating a data word at the digital output corresponding to a sample of the analog input signal;
inner decision logic, having a digital input coupled to the digital outputs of
the first and second ADC stages, for decoding the data words from the first and second ADC stages according to an error correction code to present a decoded word responsive to the data words presented by the first and second ADC stages;
a digital-to-analog converter (DAC) stage, coupled to the output of the correction logic, for generating an analog level corresponding to the decoded output word;
a final stage, comprising:
a first ADC stage, having an input receiving an analog level from the DAC stage of a previous pipelined stage, and having a digital output, for generating a data word at the digital output corresponding to a sample of that analog level; and
a second ADC stage, having an input receiving the analog level from the DAC stage of the previous pipelined stage, and having a digital output, for generating a data word at the digital output corresponding to a sample of the level;
inner decision logic, having a digital input coupled to the digital outputs of the first and second ADC stages, for decoding the data words from the first and second ADC stages according to an error correction code to present a decoded word responsive to the data words presented by the first and second ADC stages; and
at least one adder, each adder having an input coupled to an output of the DAC stage of an associated pipelined stage, having an input coupled to the analog input to its associated pipelined stage, and having an output coupled to the input of the first and second ADC stages in a next stage of the pipelined ADC, for generating an analog residue level corresponding to a difference in the analog levels at its inputs; and
outer decision logic, having inputs coupled to receive the decoded word from each pipelined stage and the final stage output word from the final stage, for generating a digital output word corresponding to the analog input signal applied to the first pipelined stage.

10. The pipelined analog-to-digital converter of claim 9, wherein the output of the first ADC stage in each of the pipelined and final stages is a k-bit digital output;
wherein the output of the second ADC stage in each of the pipelined and final stages is an n-k bit digital output;
and wherein the inner correction logic decodes the data words from the first and second ADC stages according to an (n, k) systematic code.

11. The pipelined analog-to-digital converter of claim 10, wherein the systematic code is a linear error correction code.

12. The pipelined analog-to-digital converter of claim 10, wherein n-k is less than k;
and wherein each of the pipelined and final stages further comprises:
signal conditioning circuitry, coupled to receive the analog input signal and having an output coupled to the input of the second ADC stage, for modifying the analog signal prior to application to the second ADC stage and the data word at the output of the second ADC stage so that the resolution of the second ADC stage matches that of the first ADC stage.

13. The pipelined analog-to-digital converter of claim 9, wherein the decision logic in each of the pipelined and final stages decodes the data words from the first and second ADC stages according to an error correction code to present, at an error output, an error word indicating errored bits in the digital data word presented by the first ADC stage;
wherein each of the pipelined and final stages further comprises:
correction logic, having an input coupled to the output of the first ADC stage and an input coupled to the error output of the inner decision logic, and having an output presenting the stage output word corresponding to a digital conversion of the sample of the analog input signal as corrected according to the error word;
and wherein the DAC stage in each of the pipelined stages is coupled to the output of the correction logic to receive the stage output word.

14. The pipelined analog-to-digital converter of claim 9, wherein each of the first and second ADC stages in each of the pipelined and final stages have a clock input, for controlling the sampling of the analog input signal;
and wherein the first and second ADC stages within each of the pipelined and final stages receive a clock signal at their clock inputs, in parallel.

15. A method of converting an analog input level to a digital data word representative of that analog signal, comprising the steps of:

applying the analog input level to first and second analog-to-digital converter (ADC) stages in parallel, the first ADC stage presenting a data word corresponding to a sample of the analog input level, and the second ADC stage presenting the data word corresponding to a sample of the analog input level and according to an error correction code; and decoding the data words presented by the first and second ADC stages according to the error correction code, to produce a decoded digital word representing the analog input level, wherein the decoding step comprises:

decoding the data words presented by the first and second ADC stages according to the error correction code to produce an error word indicating errored bits in the digital data word presented by the first ADC stage; and correcting one or more bits in the data word presented by the first ADC stage responsive to the error word, to produce the decoded digital word.

16. The method of claim 15, wherein the error correction code is a non-systematic code;

and wherein the first ADC stage presenting a data word corresponding to a sample of the analog input level and according to the error correction code.

17. The method of claim 15, wherein the error correction code is a systematic linear error correction code.

18. The method of claim 15, wherein the e output of the first ADC stage is a k-bit digital output;

wherein the output of the second ADC stage is an n-k bit digital output, n-k being less than k;

wherein the decision logic decodes the data words from the first and second ADC stages according to an (n, k) systematic code;

and further comprising:

modifying the analog input signal before applying it to the second ADC stage, and modifying the data word at the output of the second ADC stage, to match the resolution of the second ADC stage to that of the first ADC stage.

19. The method of claim 15, wherein the first and second ADC stages reside in a first pipelined stage;

and further comprising:

converting the decoded digital word to an output analog level;

generating a residue signal by subtracting the output analog level from the analog input signal applied to the first and second ADC stages;

applying the residue signal to a next pipeline stage comprising first and second ADC stages;

repeating the applying, decoding, converting, and generating a residue signal steps at one or more additional pipelined stages, and the applying and decoding steps at a final stage comprising first and second ADC stages;

applying the decoded digital word from each of the pipelined and final stages to outer correction logic, to produce an output digital word representing the analog 0 input level.

* * * * *